(12) United States Patent
Tsai et al.

(10) Patent No.: US 12,190,981 B2
(45) Date of Patent: Jan. 7, 2025

(54) MEMORY ARRAY HAVING ERROR CHECKING AND CORRECTION CIRCUIT

(71) Applicant: Winbond Electronics Corp., Taichung (TW)

(72) Inventors: Yao-Ting Tsai, Taichung (TW); Che-Fu Chuang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 287 days.

(21) Appl. No.: 17/866,558

(22) Filed: Jul. 18, 2022

(65) Prior Publication Data

US 2024/0021266 A1  Jan. 18, 2024

(51) Int. Cl.
| | | |
|---|---|---|
| *G11C 8/12* | (2006.01) | |
| *G11C 5/06* | (2006.01) | |
| *G11C 29/00* | (2006.01) | |
| *G11C 29/24* | (2006.01) | |
| *G11C 29/52* | (2006.01) | |
| *H10B 41/10* | (2023.01) | |
| *H10B 41/42* | (2023.01) | |
| *G11C 8/14* | (2006.01) | |

(52) U.S. Cl.
CPC .............. *G11C 29/72* (2013.01); *G11C 5/063* (2013.01); *G11C 8/12* (2013.01); *G11C 29/24* (2013.01); *G11C 29/52* (2013.01); *G11C 29/785* (2013.01); *H10B 41/10* (2023.02); *H10B 41/42* (2023.02); *G11C 8/14* (2013.01)

(58) Field of Classification Search
CPC ........... G11C 29/72; G11C 5/063; G11C 8/12; G11C 29/24; G11C 29/52; G11C 29/785; G11C 8/14; G11C 2029/0411; H10B 41/10; H10B 41/42
See application file for complete search history.

(56) References Cited

U.S. PATENT DOCUMENTS

| | | | | |
|---|---|---|---|---|
| 5,056,095 A | * | 10/1991 | Horiguchi | G06F 11/1008 714/766 |
| 7,054,219 B1 | * | 5/2006 | Petti | G11C 8/14 365/230.06 |
| 7,774,684 B2 | | 8/2010 | Bains | |
| 9,123,396 B2 | | 9/2015 | Son et al. | |
| 9,953,719 B2 | | 4/2018 | Tran et al. | |
| 10,032,523 B2 | | 7/2018 | Son et al. | |
| 10,304,528 B2 | | 5/2019 | Terada et al. | |
| 2005/0237808 A1 | * | 10/2005 | Ichikawa | G11C 16/0433 257/E27.103 |
| 2006/0221702 A1 | * | 10/2006 | Scheuerlein | G11C 5/063 365/185.23 |
| 2008/0158964 A1 | * | 7/2008 | Ishibashi | G11C 5/025 365/185.13 |
| 2009/0290403 A1 | * | 11/2009 | Tamon | G11C 16/0483 365/230.03 |
| 2019/0103440 A1 | * | 4/2019 | Inaba | H10N 70/8833 |

(Continued)

*Primary Examiner* — Mushfique Siddique
(74) *Attorney, Agent, or Firm* — JCIPRNET

(57) ABSTRACT

A memory array is provided. The memory array includes multiple memory blocks, each including multiple data storage regions and multiple groups of word lines. Each group of word lines extend across one of the memory blocks. The groups of word lines are connected to multiple overlying signal lines through multiple groups of first word line contact regions in the memory blocks and multiple second word line contact regions between the memory blocks.

18 Claims, 7 Drawing Sheets

(56) References Cited

U.S. PATENT DOCUMENTS

| | | | |
|---|---|---|---|
| 2019/0237477 A1* | 8/2019 | Baek | H10B 43/10 |
| 2022/0068940 A1* | 3/2022 | Oruganti | H01L 27/0207 |
| 2023/0328986 A1* | 10/2023 | Kwon | G11C 16/0483 |
| | | | 257/314 |

* cited by examiner

MEMORY ARRAY HAVING ERROR CHECKING AND CORRECTION CIRCUIT

BACKGROUND

Technical Field

The disclosure relates to a memory array. In particular, the disclosure relates to a flash memory array.

Description of Related Art

Memory is configured to store data in a digital system and is widely found in various electronic products. The data stored in the memory may be damaged due to various reasons during operation of the system. Such abnormality may be referred to as reduction in data retention reliability. A relatively large floating gate transistor help improve the data retention reliability for flash memory. However, the volume of the floating gate transistor has become smaller as flash memory evolves over generations. Therefore, the issue of data retention reliability has gradually emerged.

SUMMARY

An embodiment of the disclosure provides a memory array including a plurality of memory blocks and a plurality of groups of word lines. Each of the memory blocks includes a plurality of data storage regions. The plurality of groups of word lines extend across one of the plurality of memory blocks and are connected to a plurality of overlying signal lines through a plurality of groups of first word line contact regions in the plurality of memory blocks and a plurality of second word line contact regions between the plurality of memory blocks.

Another embodiment of the disclosure provides a memory array including a plurality of memory blocks and a plurality of well taps. The plurality of memory blocks are defined by a plurality of wells. The plurality of wells are disposed in a substrate and arranged in parallel. Each of the memory blocks includes a plurality of data storage regions. The plurality of well taps are located on the substrate, extend along a single outer contour surrounding the plurality of wells, and are electrically connected to the plurality of wells.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
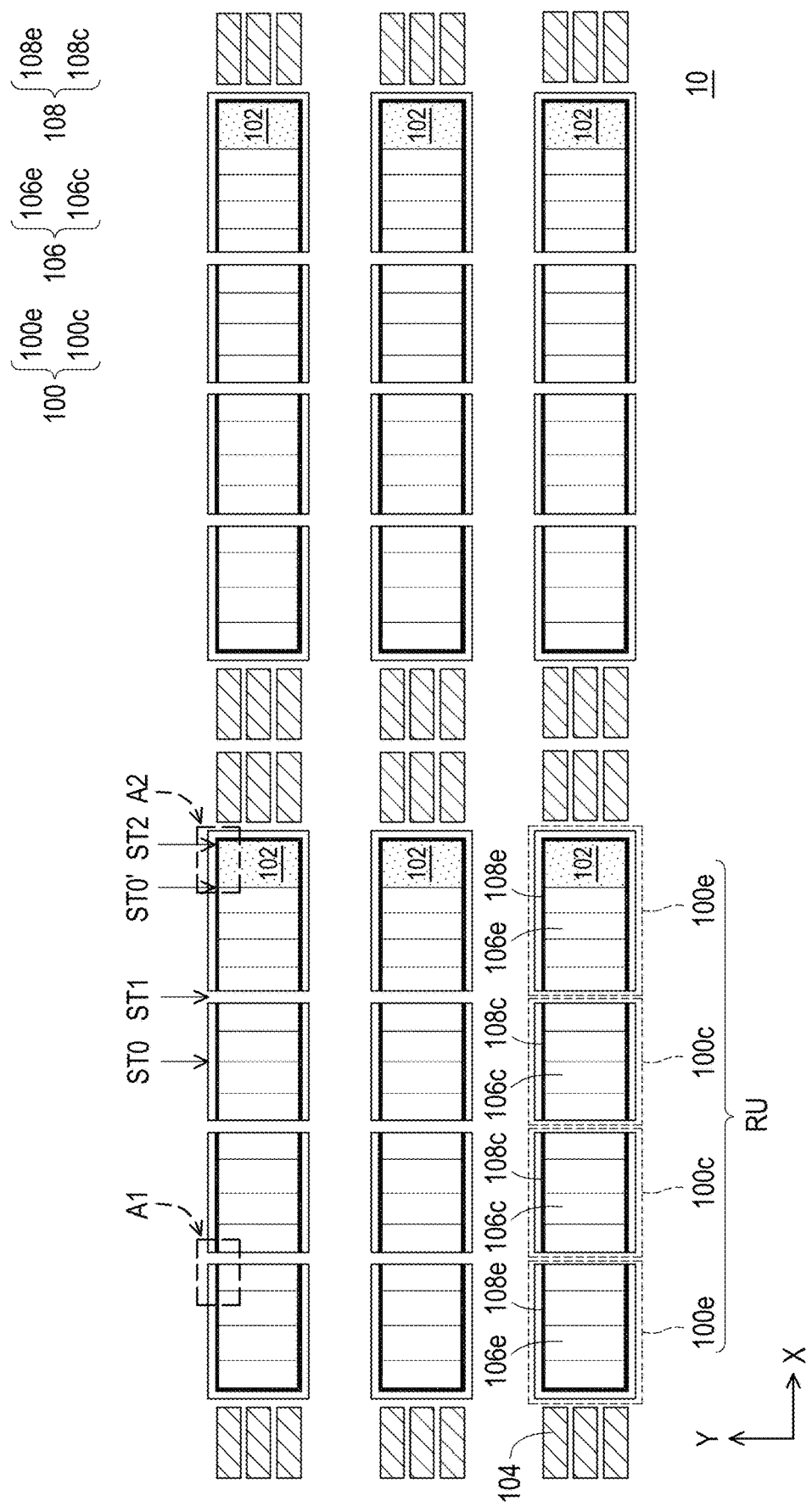
FIG. 1 is a schematic plan view of a memory array according to some embodiments of the disclosure.

FIG. 1 is a schematic plan view of a memory array 10 according to some embodiments of the disclosure. The memory array 10 may be a flash memory array. The memory array 10 includes a plurality of memory blocks 100. Although not shown in FIG. 1, each memory block 100 has a plurality of memory cells, and each memory cell may be formed by floating gate transistors.

Several memory blocks 100 arranged along a direction X may form a repeating unit RU of the memory array 10. A plurality of repeating units RU may be arranged into an array along the direction X and a direction Y intersecting the direction X. In addition, an error checking and correction (ECC) circuit region 102 is disposed in one of the memory blocks 100 in each repeating unit RU. An ECC circuit is disposed in the ECC circuit region 102 to perform ECC for other memory cells in the same repeating unit RU. In other words, the plurality of memory blocks 100 in each repeating unit RU share the ECC circuit disposed in one of the memory blocks. In some embodiments, each repeating unit RU includes four memory blocks 100, the ECC circuit region 102 is disposed in a peripheral memory block (also referred to as a memory block 100e) of the memory blocks 100, and the ECC circuit region 102 is not disposed in the other peripheral memory block 100e and central memory blocks 100 (also referred to as memory blocks 100c) located between the two peripheral memory blocks 100e.

In some embodiments, decoders 104 may be disposed around each repeating unit RU. The decoders 104 are configured to select a designated memory cell for access according to input signals. For example, a plurality of decoders 104 (e.g., two columns of decoders 104 respectively used by repeating units RU adjacent in the direction X) are respectively arranged on opposite sides extending along the direction Y of each repeating unit RU. In addition, the decoders may also be respectively disposed on opposite sides extending along the direction X of each repeating unit RU, and repeating units RU adjacent in the direction Y may share decoders (not shown) between the repeating units RU.

The memory blocks 100 each include a well 106 in a semiconductor substrate. The memory cells in each memory block 100 may be constructed on the corresponding wells 106. Hereinafter, wells 106 of the peripheral memory blocks 100e in the repeating unit RU are also referred to as wells 106e, and wells 106 of the central memory blocks 100c in the repeating unit RU are also referred to as wells 106c. For the peripheral memory block 100e including the ECC circuit region 102, the ECC circuit in the ECC circuit region 102 is also constructed on the well 106e of the peripheral memory block 100e. For example, an occupied area of the well 106e of the peripheral memory block 100e including the ECC circuit region 102 may be greater than that of the well 106c of the central memory block 100c not including the ECC circuit region 102, and greater than or equal to the well 106e of the peripheral memory block 100e not including the ECC circuit region 102. Each well 106 may be a P-type doped region or an N-type doped region in the semiconductor substrate and extends from the front side surface of the semiconductor substrate into the semiconductor substrate. In addition, the plurality of wells 106 are laterally spaced apart from each other. In some embodiments, the plurality of wells 106 are spaced apart by isolation structures (not shown) disposed in the semiconductor substrate.

Figure 2:
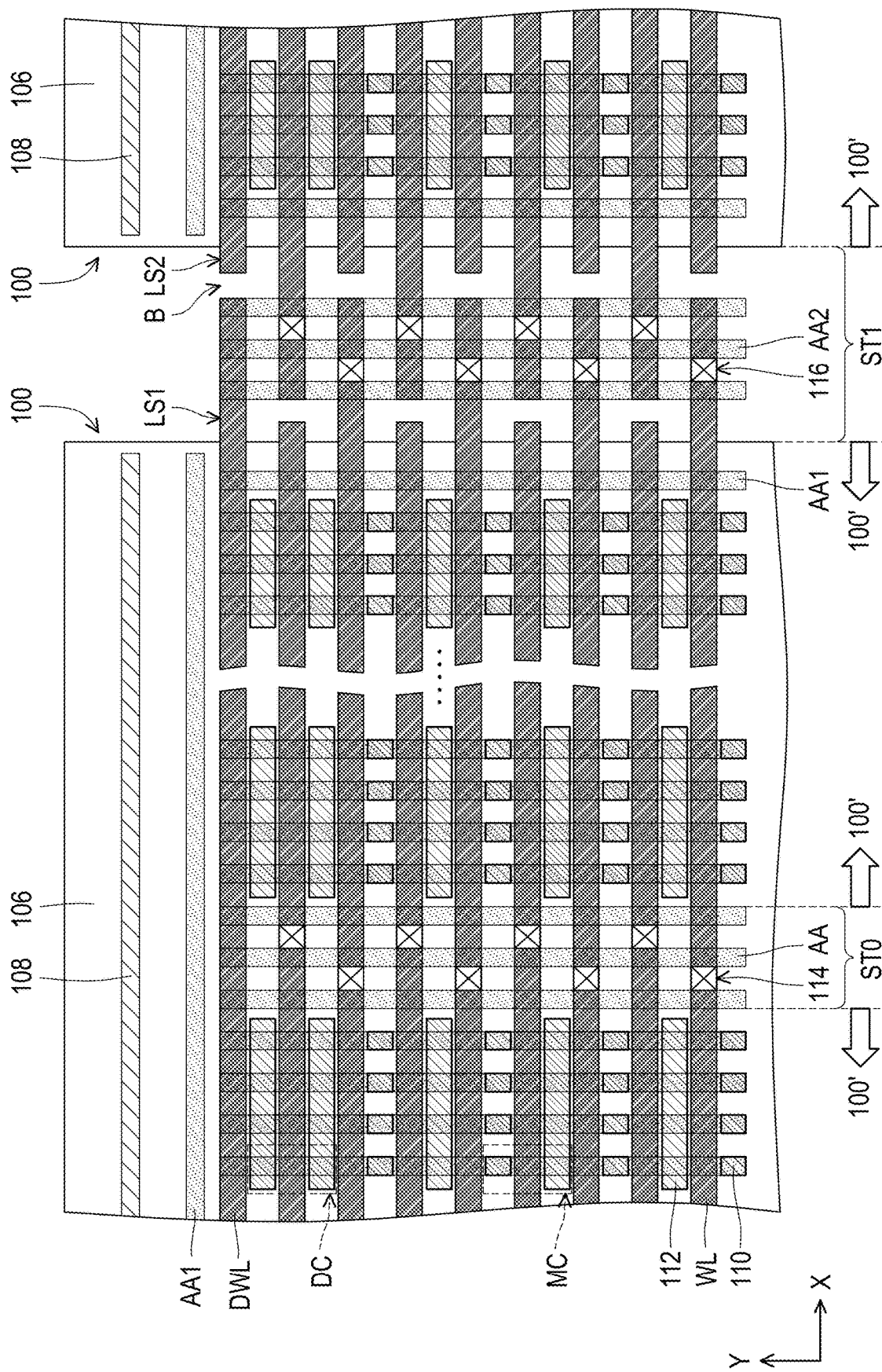
FIG. 2 is a schematic enlarged plan view of region A1 in FIG. 1.

In some embodiments, a plurality of well taps 108 are disposed above the semiconductor substrate. The well taps 108 are configured to be electrically connected to the wells 106 to provide a bias voltage to the wells 106. Each well tap 108 extends along a contour of the underlying well 106. In some embodiments, well taps 108 (also referred to as well taps 108e) on the wells 106e at two ends of each repeating unit RU respectively surround the corresponding wells 106e on three sides, and each have a lateral opening facing the other wells 106 in the same repeating unit RU. In addition, well taps 108 (also referred to as well taps 108c) on the wells 106c between the two ends of each repeating unit RU respectively extend along two opposite sides in the direction X of the underlying wells 106c, and each have two line segments separated from each other and extending along the direction X. As such, a single outer contour of all the wells 106 of each repeating unit RU may be surrounded by a group of well taps 108. Moreover, the well taps 108 do not extend into the region between adjacent wells 106 in each repeating unit RU. In some embodiments, each well tap 108 extends inside the contour of the underlying well 106 (as shown in FIG. 2). In some embodiments, adjacent well taps 108 are laterally spaced apart from each other.

FIG. 2 is a schematic enlarged plan view of region A1 in FIG. 1. The detailed structure in each memory block 100 and between adjacent memory blocks 100 will be described below with reference to FIG. 2. Each memory block 100 includes a plurality of active regions AA. The channel region of the floating gate transistors forming the memory cells MC may be formed in the active regions AA. The active regions AA are doped regions located in the well 106. Typically, a conductivity type of the active regions AA is complementary to a conductivity type of the well 106. For example, when the well 106 is an N-type doped region, the active regions AA may be P-type doped regions. In some embodiments, the active regions AA each extend along the direction Y and are laterally spaced from each other in the direction X.

In some embodiments, a dummy active region AA1 is further disposed in each memory block 100. Similar to the active regions AA, the dummy active region AA1 is also a doped region in the well 106. The dummy active region AA1 may surround the active regions AA, and may have the same conductivity type as the active regions AA. In some embodiments, the dummy active region AA1 may include two dummy active regions AA1 extending along the direction X on two sides of the active regions AA, and may optionally include two other dummy active regions AA1 extending along the direction Y on two other sides of the active regions AA. In these embodiments, the dummy active regions AA1 may be spaced apart from each other. In addition, in some embodiments, a dummy active region AA2 may also be disposed between adjacent memory blocks 100. The dummy active region AA2 is also a doped region disposed in the semiconductor substrate, and has the same conductivity type as the active regions AA. In the embodiment where the active regions AA are extended along the direction Y and arranged along the direction X, the dummy active region AA2 may also be extended along the direction Y and arranged along the direction X. Different from the active regions AA and the dummy active region AA1, the dummy active region AA2 is located between adjacent wells 106 and is not in the well 106.

A word line WL intersecting the active regions AA may be disposed on the semiconductor substrate. The word line WL may extend across the wells 106 and intersect the active regions AA, and may serve as a control gate of the floating gate transistors forming the memory cells MC. In addition, the word line WL may further intersect the dummy active region AA1 and the dummy active region AA2 parallel to the active regions AA. A tunneling dielectric layer, a floating gate, and an inter-gate dielectric layer (none shown) may also be disposed between the word line WL and the active regions AA. Similarly, a tunneling dielectric layer, a floating gate, and an inter-gate dielectric layer (none shown) may also be disposed between the word line WL and the dummy active regions AA1 and AA2 intersecting the word line WL. In an embodiment where the active regions AA extend along the direction Y, the word line WL may extend along the direction X. The word lines WL extending above adjacent wells 106 are spaced apart from each other. In some embodiments, breaks B between two groups of word lines WL extending across two adjacent wells 106 in the direction X are alternately located on opposite sides along the direction Y of the dummy active region AA2 between the two adjacent wells 106. Accordingly, the two groups of word lines WL alternately intersect the dummy active region AA2 between the two adjacent wells 106.

A plurality of first drain/source contact structures 110 and second drain/source contact structures 112 may further be disposed in each memory block 100. The first and second drain/source contact structures 110 and 112 are disposed on the semiconductor substrate and are electrically connected to parts of the active regions AA located on opposite sides of each word line WL. The first drain/source contact structures 110 may each be a columnar structure, and each overlapped with a single active region AA. In addition, the second drain/source contact structures 112 may each be formed into a conductive wall, and each overlapped with a plurality of active regions AA. A row of first drain/source contact structures 110 and a row of second drain/source contact structures 112 may be disposed on opposite sides of each word line WL. A floating gate transistor serving as a memory cell MC may be defined at the intersection between a word line WL and an active region AA, so that the word line WL serves as a control gate of the floating gate transistor, and the first drain/source contact structures 110 and the second drain/source contact structures 112 located on opposite sides of the word line WL in the active region AA serve as the drain and the source of the floating gate transistor. Each word line WL and each second drain/source contact structure 112 may be shared by a row of memory cells MC, and each active region AA may be shared by a column of memory cells MC. In some embodiments, each first drain/source contact structure 110 or second drain/source contact structure 112 may be shared by adjacent memory cells MC in the same column.

In addition, each memory block 100 may further include dummy memory cells DC. different the memory cells MC, the dummy memory cells DC are not configured to access data. The dummy memory cells DC may be located around the memory cells MC and be structurally similar to the memory cells MC. As a difference from the memory cells MC, some dummy memory cells DC may each have a pair of first and second drain/source contact structures 110 and 112, other dummy memory cells DC may each have a pair of second drain/source contact structures 112, and still other dummy memory cells DC may each have only a single second drain/source contact structure 112.

In some embodiments, a dummy word line DWL is further disposed on the semiconductor substrate. The dummy word line DWL may be parallel to the word line WL and may intersect the active regions AA at a distal end. In addition, similar to the word line WL, the dummy word line DWL may also be extended into and break apart in the region between adjacent memory blocks 100.

With reference to FIG. 1 and FIG. 2, a plurality of word line contact regions ST0 spaced apart from each other are designed in each memory block 100, and separate each memory block 100 into a plurality of data storage regions 100'. The memory cells MC in the data storage regions 100' are configured to access data. In addition, the word line WL runs through the data storage regions 100' and the word line contact regions ST0, and may be connected to an overlying signal line (not shown) through the word line contact regions ST0 to receive control signals. A plurality of word line contact structures 114 may be disposed in the word line contact regions ST0, and route the word line WL upward. The word line contact structures 114 may each be a columnar structure positioned on one word line WL. The word line contact structures 114 in each word line contact region ST0 may each be spaced apart from adjacent word line contact structures 114 in the direction X and the direction Y. In some embodiments, the word line contact structures 114 in each word line contact region ST0 are arranged into two columns along the direction X, and one column of word line contact structures 114 are offset relative to the other column of word line contact structures 114 along the direction Y. In these embodiments, the word line contact structures 114 in each word line contact region ST0 may be alternately disposed along the direction Y on opposite sides of an active region AA. For example, three active regions AA may be disposed in each word line contact region ST0, and the word line contact structures 114 may be alternately disposed along the direction Y on opposite sides of the middle active region AA.

In some embodiments, the first drain/source contact structures 110 and the second drain/source contact structures 112 are not disposed in each word line contact region ST0. In some embodiments, the first drain/source contact structures 110 are distributed in the data storage regions 100' outside the word line contact regions ST0, and the second drain/source contact structures 112 break apart at the word line contact regions ST0. As such, the word line WL still intersects the active regions AA in the word line contact regions ST0 and forms floating transistors. However, since the floating transistors in the word line contact regions ST0 are not controlled by the first and second drain/source contact structures 110 and 112, the floating transistors in the word line contact regions ST0 may not serve as memory cells. In other words, the memory cells MC in each memory block 100 may be distributed in the data storage regions 100' outside the word line contact regions ST0. Similarly, the dummy memory cells DC in each memory block 100 may also be distributed in the data storage regions 100' outside the word line contact regions ST0.

In addition to the word line contact regions ST0, a word line contact region ST1 is further disposed between adjacent memory blocks 100. The word line WL running through each memory block 100 may enter an adjacent word line contact region ST1 and break apart at the break B. The word line WL may be connected to an overlying signal line (not shown) through the word line contact region ST1 to receive control signals. A plurality of word line contact structures 116 may be disposed in the word line contact region ST1 and route the word line WL upward. The word line contact structures 116 may each be a columnar structure positioned one word line WL. In addition, the word line contact structures 116 in each word line contact region ST1 may also each be spaced apart from adjacent word line contact structures 116 in the direction X and the direction Y. In some embodiments, the word line contact structures 116 in each word line contact region ST1 are arranged into two columns along the direction X, and one column of word line contact structures 116 are offset relative to the other column of word line contact structures 116 along the direction Y. In these embodiments, the word line contact structures 116 in each word line contact region ST1 may be alternately disposed along the direction Y on opposite sides of a dummy active region AA2. For example, three dummy active regions AA2 may be disposed in each word line contact region ST1, and the word line contact structures 116 may be alternately disposed along the direction Y on opposite sides of the middle dummy active region AA2. In addition, in these embodiments, the word line WL extending from each memory block 100 to the word line contact region ST1 may have a long line segment LS1 and a short line segment LS2 located in the word line contact region ST1, and the long line segment LS1 and the short line segment LS2 may be alternately arranged along the direction Y. Moreover, each break B of the word lines may be located between a long line segment LS1 and a short line segment LS2.

Regarding the differences, the word line contact regions ST0 are located in each memory block 100, while the word line contact region ST1 is located between adjacent memory blocks 100. In other words, the word line contact regions ST0 are located within the range of the well 106 defining each memory block 100, and the word line contact region ST1 is located between adjacent wells 106. In some embodiments, except that the word line WL extends to the word line contact region ST1, the active region AA, the dummy active region AA1, the first drain/source contact structures 110, the second drain/source contact structures 112, the word line contact structures 114, and the well taps 108 among other components in each memory block 100 are not distributed in or extended to the word line contact region ST1. In addition, in the embodiment where the dummy word line DWL is disposed, the dummy word line DWL may extend through the word line contact regions ST0 to the adjacent word line contact region ST1, but may not be connected to an overlying signal line (not shown) through the word line contact structures 114 and 116.

Figure 3:
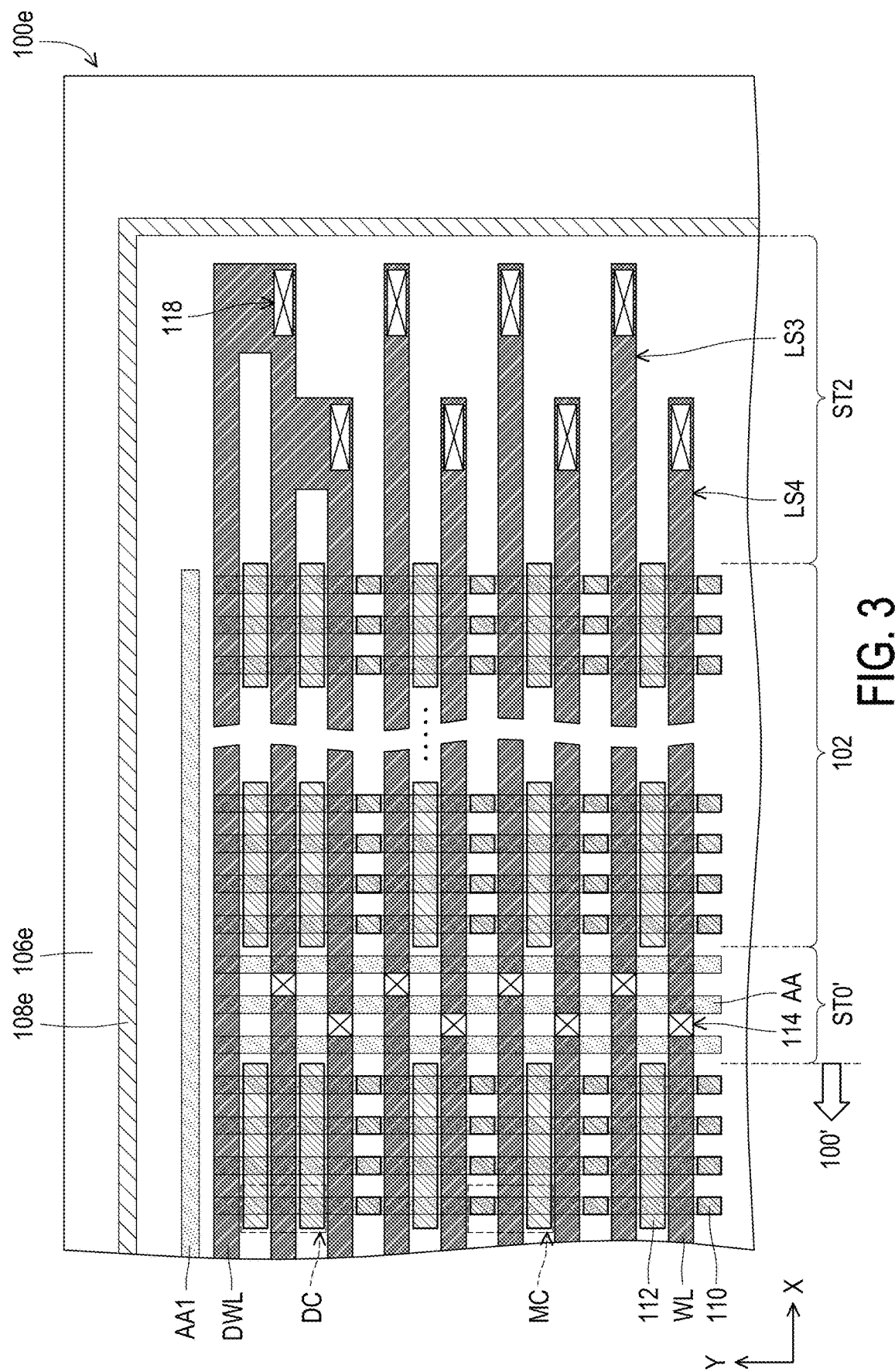
FIG. 3 is a schematic enlarged plan view of region A2 in FIG. 1.

FIG. 3 is a schematic enlarged plan view of region A2 in FIG. 1. The detailed structure of the peripheral memory block 100e including the ECC circuit region 102 will be described with reference to FIG. 3.

With reference to FIG. 1 and FIG. 3, in some embodiments, the layout of the ECC circuit region 102 is the same as the layout of the plurality of data storage regions 100' separated by the word line contact regions ST0 in each memory block 100. In these embodiments, the plurality of active regions AA, the word line WL intersecting the active regions AA, and the first and second drain/source contact structures 110 and 112 disposed on parts of the active regions AA located on opposite sides of each word line WL are disposed in the ECC circuit region 102, and may form the plurality of memory cells MC and the plurality of dummy memory cells DC. However, the memory cells MCs located in the ECC circuit region 102 are specifically configured to perform ECC for the data stored in the memory cells MCs in each data storage region 100'. In addition, in the embodiment where the dummy word line DWL is disposed, the dummy word line DWL may extend into the ECC circuit region 102 and intersect the active regions AA in the ECC circuit region 102. Moreover, in some embodiments, the dummy active region AA1 in the peripheral memory block 100e extends on opposite sides of the active regions AA along the direction X.

As shown in FIG. 1, the ECC circuit region 102 is located on a side of a peripheral memory block 100e farthest away from the adjacent central memory block 100c. In these embodiments, each ECC circuit region 102 is adjoined through an additional word line contact region ST0' to the adjacent data storage region 100' in the peripheral memory block 100e to which the ECC circuit region 102 belongs. Therefore, compared to the central memory block 100c and the peripheral memory block 100e not including the ECC circuit region 102, the peripheral memory block 100e including the ECC circuit region 102 has the word line contact regions ST0' in addition to the plurality of word line contact regions ST0.

With reference to FIG. 3, the layout of the word line contact region ST0' is the same as the layout of the word line contact regions ST0 described with reference to FIG. 2. In other words, the word line WL running through the ECC circuit region 102 and the data storage regions 100' also runs through the word line contact region ST0', and may intersect the active regions AA disposed in the word line contact region ST0'. In addition, in the word line contact region ST0', the word line WL is connected to an overlying signal line (not shown) through the word line contact structures 114. In the embodiment where the dummy word line DWL is disposed, the dummy word line DWL also runs through the word line contact region ST0', but may not be routed upward by the word line contact structures 114.

Moreover, the ECC circuit region 102 may also be adjoined to a word line contact region ST2. The word line contact region ST2 may be located at an edge of the peripheral memory block 100e, so that the ECC circuit region 102 is located between the word line contact regions ST0' and ST2. The word line WL may extend from above the ECC circuit region 102 into the range of the word line contact region ST2, and may be connected to an overlying signal line (not shown) through the word line contact region ST2 to receive control signals. A plurality of word line contact structures 118 may be disposed in the word line contact region ST2 and route the word line WL upward. The word line contact structures 118 may each be a columnar structure positioned on one word line WL at a distal end. In some embodiments, the word line contact structures 118 may be larger than the word line contact structures 114 and the word line contact structures 116 in terms of dimensions (e.g., a length or a width). In the embodiment where the dummy word line DWL is disposed, the dummy word line DWL may extend from the ECC circuit region 102 into the word line contact region ST2. Moreover, the dummy word line DWL may be connected to several adjacent word lines WL in the word line contact region ST2 to receive the same signals.

In some embodiments, the word line WL extending into the word line contact region ST2 has a long line segment LS3 and a short line segment LS4 located in the word line contact region ST2, and the long line segment LS3 and the short line segment LS4 may be alternately arranged along the direction Y. In these embodiments, the word line contact structures 118 positioned on each word line WL at a distal end may be arranged into two columns, and one column of word line contact structures 118 may be displaced relative to the other column of word line contact structures 118 along the direction Y. In addition, in the embodiment where the dummy word line DWL is disposed, the line segment of the dummy word line DWL located in the word line contact region ST2 may have the equal length as the line segment of the adjacent word line WL in the word line contact region ST2.

In some embodiments, the active regions AA, the first drain/source contact structures 110, and the second drain/source contact structures 112 in the peripheral memory block 100e are not distributed in or extended into the word line contact region ST2. In the embodiment where the dummy active region AA1 is disposed, the dummy active region AA1 may not extend into the word line contact region ST2.

Figure 4:
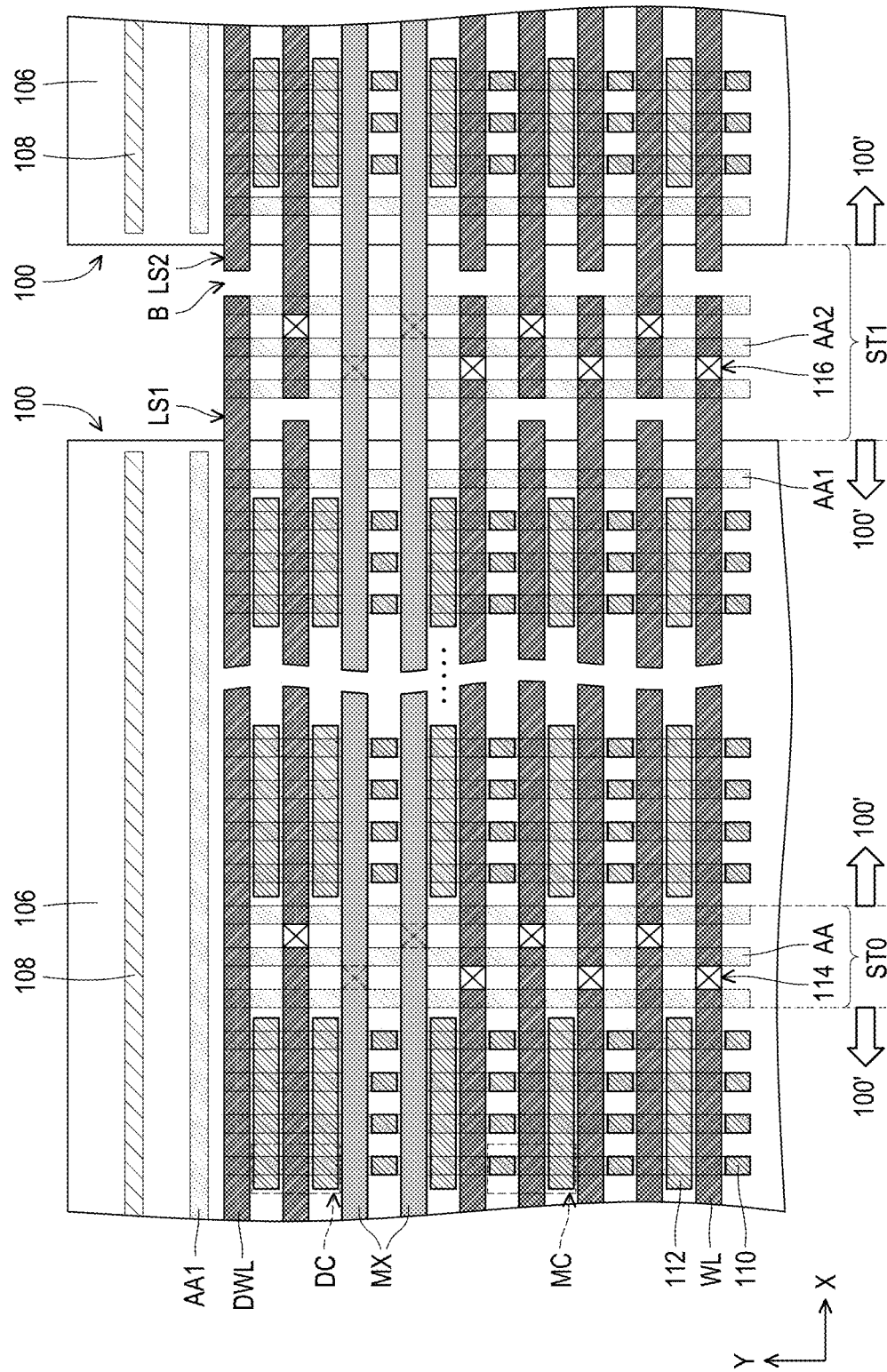
FIG. 4 exemplarily shows a signal line connected to an adjacent word line according to some embodiments.

As described with reference to FIG. 2 and FIG. 3, each word line WL may be connected to an overlying signal line through the word line contact regions ST0, ST0', ST1, and ST2. FIG. 4 shows two of the signal lines MX.

With reference to FIG. 4, the signal line MX may be extended along the direction X and overlapped with the plurality of underlying word lines WL extending across the plurality of memory blocks 100. The word lines WL may be connected to the signal line MX through the word line contact structures 114 and 116 in the word line contact regions ST0 and ST1, and the word line contact structures 114 and 118 in the word line contact regions ST0' and ST2 described with reference to FIG. 3. In other words, the word lines WL may be interconnected with each other to receive the same signals. In addition, the data storage regions 100' and the ECC circuit region 102 may be interconnected by the signal line MX, so that the ECC circuit region 102 may perform ECC for the data storage regions 100'. Although FIG. 4 shows only two signal lines MX, more signal lines MX parallel to the word lines WL may be disposed to interconnect the plurality of word lines WL arranged along the direction X in the actual case.

Figure 5:
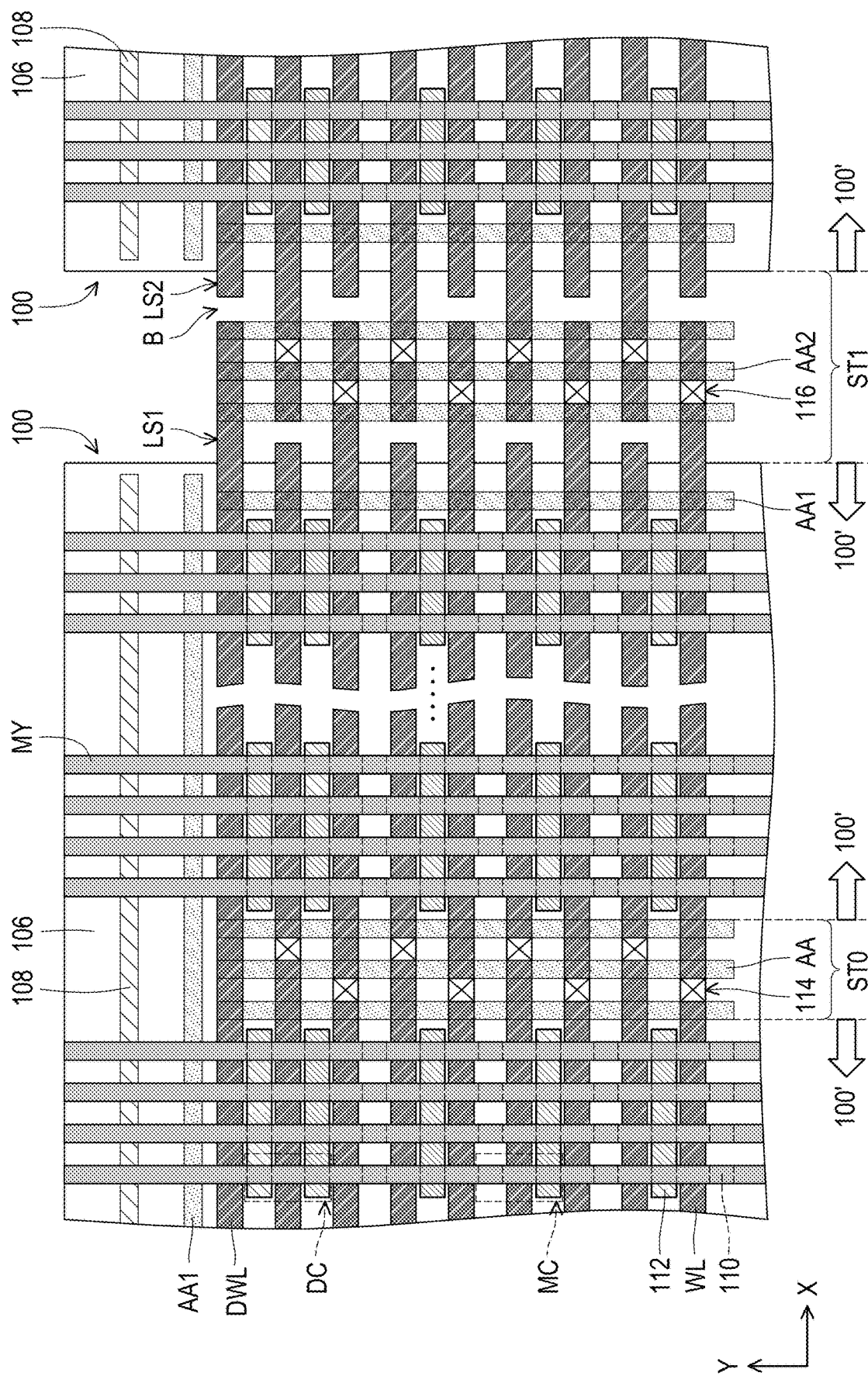
FIG. 5 shows a plurality of signal lines connected to the first drain/source contact structure and the second drain/source contact structure according to some embodiments.

FIG. 5 shows signal lines MY connected to the first drain/source contact structures 110 and the second drain/source contact structures 112 according to some embodiments.

With reference to FIG. 5, a plurality of signal lines MY extend above the active regions AA, and may be substantially parallel to the active regions AA. In addition, the signal lines MY may be connected to the first drain/source contact structures 110 and the second drain/source contact structures 112 on the active regions AA. The signal line MY connected to the first drain/source contact structure 110 may also be referred to as a bit line, and the signal line MY connected to the second drain/source contact structure 112 may also be referred to as a source line. The bit line and the source line may be arranged along a direction (e.g., the direction X) intersecting the active regions AA. In some embodiments, a plurality of bit lines may be arranged between adjacent source lines. For example, 2,048 bit lines extend across the memory blocks 100, and 256 bit lines may be arranged between adjacent source lines.

Although not shown, the signal lines MY including the bit lines and the source lines are also distributed on the ECC circuit region 102 described with reference to FIG. 3 to provide signals to the first drain/source contact structures 110 and the second drain/source contact structures 112 in the ECC circuit region 102. In addition, the arrangement period of the bit lines and the source lines on the ECC circuit region 102 may be the same as the arrangement period of the bit lines and the source lines on the data storage regions 100'.

In some embodiments, the signal lines MY extend below or above the signal lines MX as described with reference to FIG. 4. For example, the signal lines MY and the well taps 108 may extend below the signal lines MX.

Figure 6:
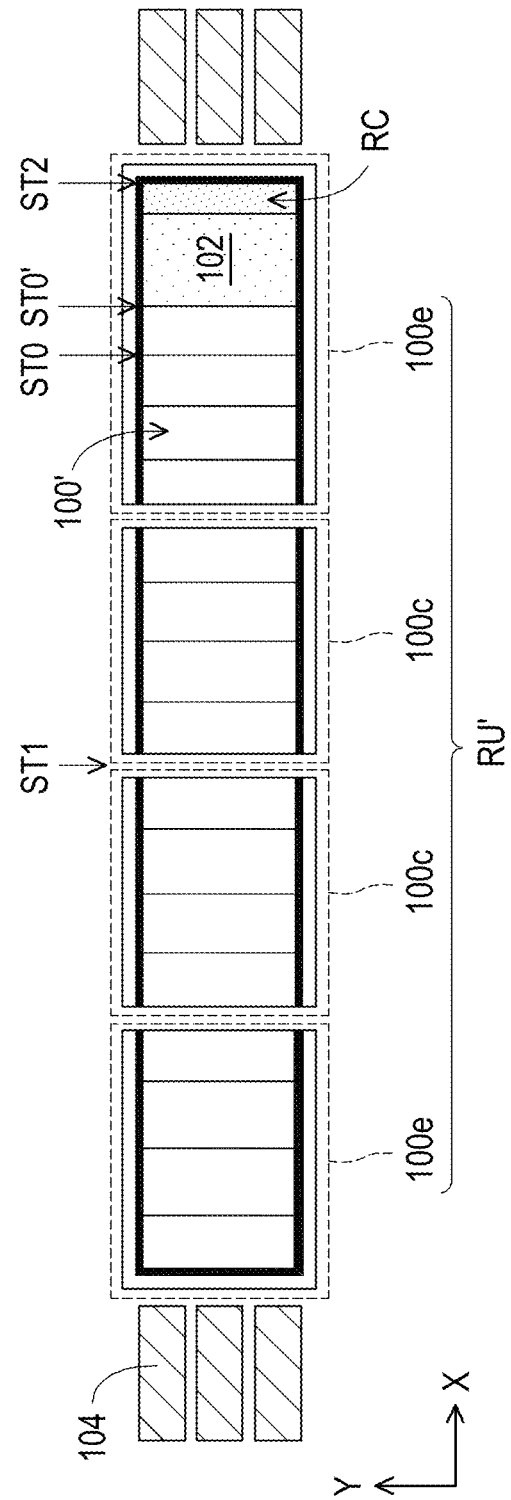
FIG. 6 shows a repeating unit in a memory array according to other embodiments.
Figure 7:
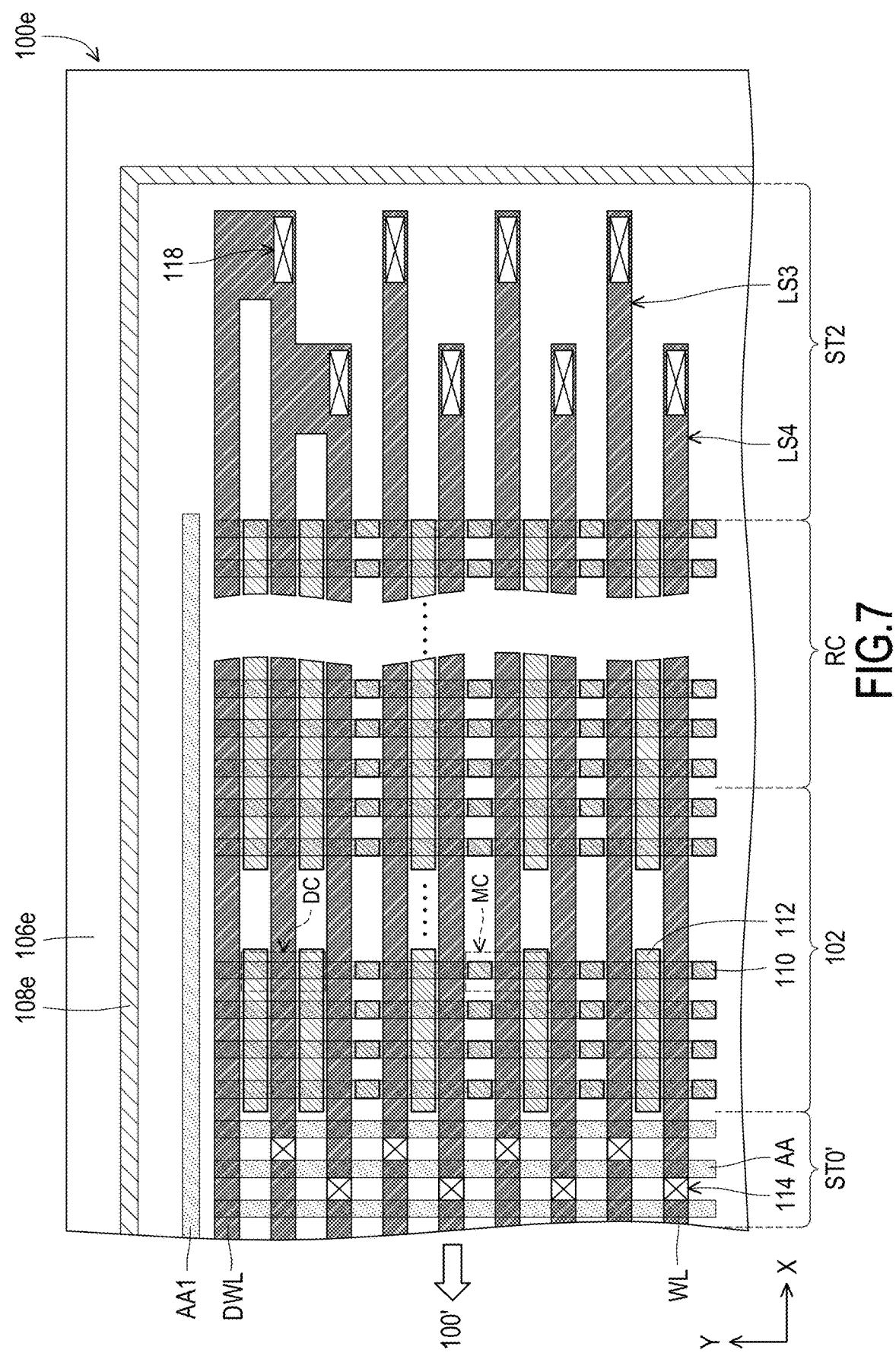
FIG. 7 shows the detailed structure of a peripheral part of the repeating unit of FIG. 6.

FIG. 6 shows a repeating unit RU' in a memory array according to other embodiments. FIG. 7 shows the detailed structure of a peripheral part of the repeating unit RU'. The memory array including a plurality of repeating units RU' is similar to the memory array 10 including the plurality of repeating units RU described with reference to FIG. 1. Therefore, the following description is directed to only the differences between the repeating units RU' and RU without repeatedly describing the commonality or similarity.

With reference to FIG. 6 and FIG. 7, the peripheral memory block 100e in each repeating unit RU' may further include a redundant cell region RC. The layout in the redundant cell region RC may be the same as the layout in the data storage regions 100'. Nonetheless, the memory cells MC in the redundant cell region RC is specifically configured to replace damaged memory cells (if any) in all the data storage regions 100' in the same repeating unit RU'.

The redundant cell region RC may be located between the ECC circuit region 102 and the word line contact region ST2. The word line WL extending across the ECC circuit region 102 may further extend through the redundant cell region RC and enter the word line contact region ST2. In some embodiments, no word line contact region is disposed between the ECC circuit region 102 and the redundant cell region RC. In these embodiments, the memory cells MC and the dummy memory cells DC may be continuously arranged across the boundary between the ECC circuit region 102 and the redundant cell region RC. In addition, in some embodiments, the dummy active region AA1 disposed in the peripheral memory block 100e further extends along opposite sides of the redundant cell region RC.

In addition, as shown in FIG. 6, the redundant cell region RC may not be disposed in the central memory block 100c and the peripheral memory block 100e where the ECC circuit region 102 is not disposed. In other words, the ECC circuit region 102 and the redundant cell region RC may be disposed in only a single peripheral block 100e in each repeating unit RU', which prevents a great increase in the occupied area of each repeating unit RU'.

In summary of the foregoing, according to the embodiments of the disclosure, several memory blocks arranged along the row direction form a repeating unit of the flash memory array. The word lines of all memory blocks in each repeating unit may be connected upward to signal lines extending across the repeating unit through the word line contact regions in each memory block and the word line contact regions between adjacent memory blocks. With this design, the plurality of memory blocks in the same repeating unit may share the ECC circuit configured to improve data retention reliability through the signal lines. As such, compared to disposing an ECC circuit in each memory block, in the embodiments of the disclosure, the plurality of memory blocks in the same repeating unit may share the ECC circuit in a single ECC circuit region, which effectively saves the occupied area of the flash memory array. On top of that, the number of word line contact regions (i.e., the word line contact region ST0') required between the ECC circuit region and the data storage region may also be reduced on the basis that fewer ECC circuit regions are employed to perform ECC. Accordingly, the limited wafer area can be optimally utilized.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory array comprising:
   a repeating unit comprising:
   a plurality of memory blocks, each of the plurality of memory blocks comprising a plurality of data storage regions; and
   a plurality of groups of word lines extending across one of the plurality of memory blocks and being connected to a plurality of overlying signal lines through a plurality of groups of first word line contact regions in the plurality of memory blocks and a plurality of second word line contact regions between the plurality of memory blocks,
   wherein a peripheral memory block in the plurality of memory blocks further comprises an error checking and correction circuit region, and an error checking and correction circuit in the error checking and correction circuit region is configured to perform error checking and correction for the plurality of data storage regions of each of the plurality of memory blocks in the repeating unit.

2. The memory array according to claim 1, wherein each of the groups of word lines continuously extends through a first word line contact region in the plurality of groups of first word line contact regions, and adjacent two groups of word lines in the plurality of groups of word lines are spaced apart from each other at one of the plurality of second word line contact regions.

3. The memory array according to claim 1, wherein the plurality of data storage regions in each of the memory blocks are spaced apart from each other by a group of first word line contact regions in the plurality of groups of first word line contact regions.

4. The memory array according to claim 3, wherein a plurality of active regions in each of the memory blocks are distributed in the plurality of data storage regions and the group of first word line contact regions in the plurality of groups of first word line contact regions in each of the memory blocks.

5. The memory array according to claim 4, wherein a plurality of word line contact structures electrically connect the plurality of groups of word lines and the plurality of signal lines, and a first group of word line contact structures in the plurality of word line contact structures is located in a first word line contact region in the plurality of groups of first word line contact regions, and are alternately arranged on both sides of one of the plurality of active regions along a direction intersecting an extension direction of the plurality of groups of word lines.

6. The memory array according to claim 5, wherein adjacent two of the first group of word line contact structures are spaced apart from each other in a first direction and a second direction intersecting the first direction.

7. The memory array according to claim 5, wherein a second group of word line contact structures in the plurality of word line contact structures is located in one of the plurality of second word line contact regions, and adjacent two of the second group of word line contact structures are spaced apart from each other in a first direction and a second direction intersecting the first direction.

8. The memory array according to claim 1, wherein a plurality of drain/source contact structures are disposed in the plurality of memory blocks, and the plurality of drain/source contact structures are not distributed into the plurality of groups of first word line contact regions.

9. The memory array according to claim 8, further comprising a plurality of additional signal lines connected to the plurality of drain/source contact structures and being parallel to a plurality of active regions in the plurality of memory blocks.

10. The memory array according to claim 1, wherein the peripheral memory block in the plurality of memory blocks further comprises a third word line contact region located between the error checking and correction circuit region and the plurality of data storage regions, and a group of word lines in the plurality of groups of word lines is further connected to the plurality of overlying signal lines through a plurality of word line contact structures in the third word line contact region.

11. The memory array according to claim 10, wherein a plurality of active regions in the peripheral memory block of the plurality of memory blocks are further distributed in the third word line contact region, and a plurality of drain/source contact structures in the peripheral memory block in the plurality of memory blocks are not distributed into the third word line contact region.

12. The memory array according to claim 10, further comprising a fourth word line contact region adjoined to the error checking and correction circuit region of the peripheral memory block in the plurality of memory blocks, the group of word lines in the plurality of groups of word lines is connected to the plurality of signal lines through a plurality of word line contact structures in the fourth word line contact region, and the error checking and correction circuit region is located between the third word line contact region and the fourth word line contact region.

13. The memory array according to claim 12, wherein the group of word lines in the plurality of groups of word lines has a plurality of long distal-end line segments and a plurality of short distal-end line segments located in the fourth word line contact region, the plurality of long distal-end line segments and the plurality of short distal-end line segments are alternately arranged along a direction intersecting an extension direction of the plurality of groups of word lines.

14. The memory array according to claim 1, wherein a plurality of dummy active regions are disposed in each of the second word line contact regions, and a conductivity type and an extension direction of the plurality of dummy active regions are respectively the same as a conductivity type and an extension direction of a plurality of active regions in each of the memory blocks.

15. The memory array according to claim 1, wherein the peripheral memory block in the plurality of memory blocks further comprises a redundant cell region, wherein the redundant cell region has a redundant cell configured to replace a damaged memory cell in the plurality of memory blocks, and wherein memory blocks other than the peripheral memory block in the plurality of memory blocks do not comprise the redundant cell region configured to replace the damaged memory cell.

16. The memory array according to claim 1, wherein the plurality of signal lines extend across the plurality of memory blocks, and wherein the plurality of signal lines are parallel to the plurality of groups of word lines.

17. A memory array comprising:
a plurality of memory blocks defined by a plurality of wells, wherein the plurality of wells are disposed in a substrate and arranged in parallel, and each of the memory blocks comprises a plurality of data storage regions; and
a plurality of well taps located on the substrate, extending along a single outer contour surrounding the plurality of wells, and electrically connected to the plurality of wells,
wherein the plurality of well taps comprise:
two first well taps respectively surrounding two peripheral wells in the plurality of wells on three sides; and
a plurality of second well taps each having two line segments separated from each other, the plurality of second well taps extending along opposite sides of a plurality of central wells in the plurality of wells.

18. The memory array according to claim 17, wherein the plurality of well taps do not extend to a region between the plurality of wells.

* * * * *